United States Patent [19]

Kasubuchi et al.

[11] 4,177,519

[45] Dec. 4, 1979

[54] ELECTRONIC CONTROL ASSEMBLY MOUNTED ON A FLEXIBLE CARRIER AND MANUFACTURE THEREOF

[75] Inventors: Takeshi Kasubuchi, Nara; Kaoru Ozawa, Yamatokoriyama; Takeo Hara, Ikoma, all of Japan

[73] Assignee: Sharp Kabushiki Kaisha, Osaka, Japan

[21] Appl. No.: 897,116

[22] Filed: Apr. 17, 1978

Related U.S. Application Data

[63] Continuation of Ser. No. 709,518, Jul. 28, 1976, abandoned.

[30] Foreign Application Priority Data

Jul. 28, 1975 [JP] Japan ............................ 50-92302

[51] Int. Cl.² ........................................... H05K 3/30
[52] U.S. Cl. .................................... 364/712; 174/68.5
[58] Field of Search ............. 364/712, 708; 29/577 C, 29/589, 626, 627; 174/68.5

[56] References Cited

U.S. PATENT DOCUMENTS

| | | | |
|---|---|---|---|
| 3,755,806 | 8/1973 | Bunting | 340/324 R |
| 3,780,431 | 12/1973 | Feeney | 29/626 |
| 3,908,075 | 9/1975 | Jackson et al. | 174/68.5 |
| 3,911,234 | 10/1975 | Kotaka | 174/68.5 X |
| 3,984,620 | 10/1976 | Robillard | 29/627 X |
| 4,002,892 | 1/1977 | Zielinski | 364/708 |
| 4,049,903 | 9/1977 | Kobler | 174/68.5 |
| 4,074,118 | 2/1978 | Washizuka et al. | 364/712 |

*Primary Examiner*—David H. Malzahn
*Attorney, Agent, or Firm*—Birch, Stewart, Kolasch and Birch

[57] ABSTRACT

A semiconductor chip including, for example, a computation circuit and a display driver, an electronic circuit chip including a peripheral electronic circuitry, and a power supply circuit element are integrally mounted on a single frame of flexible carrier tape. Connection leads are formed on both sides of the carrier tape for electrically connecting the electronic components mounted on the carrier tape to a display unit and a power source.

11 Claims, 10 Drawing Figures

ELECTRONIC CONTROL ASSEMBLY MOUNTED ON A FLEXIBLE CARRIER AND MANUFACTURE THEREOF

This application is a continuation of copending application Ser. No. 709,518, filed on July 28, 1976, now abandoned.

BACKGROUND AND SUMMARY OF THE INVENTION

The present invention relates to an electronic assembly mounted on a single frame of flexible carrier tape and, more particularly, to calculator electronics integrally mounted on a single frame of flexible carrier tape.

It has been proposed to provide a semiconductor device mounted on a flexible carrier for the sake of reduction of manufacturing cost and facilitating the mass production. For example, U.S. Pat. No. 3,763,404, "SEMICONDUCTOR DEVICES AND MANUFACTURE THEREOF" to Alanson D. Aird shows a semiconductor device mounted on a flexible carrier. In the prior art technique, only one semiconductor chip is mounted on a single frame of the flexible carrier and, therefore, in fabricating an electronic apparatus, the fabrication steps are not simplified even when the semiconductor device mounted on the flexible carrier is used as compared with the case in which a conventional semiconductor device having a solid package is used.

Accordingly, an object of the present invention is to provide an electronic assembly mounted on a single frame of flexible carrier tape.

Another object of the present invention is to provide calculator electronics, including a computation circuit, a display driver, a peripheral electronic circuitry and a power supply circuit, integrally mounted on a single frame of flexible carrier tape.

Still another object of the present invention to provide a method for manufacturing calculator electronics integrally mounted on a single frame of flexible carrier tape.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a semiconductor chip including, for example, a computation circuit and a display driver, an electronic circuit chip including a peripheral eletronic circuitry, a power supply circuit element, and a transformer are integrally mounted on a single frame of flexible carrier tape. Connection leads are formed on both sides of the carrier tape for electrically connecting the electronic components mounted on the carrier tape to a display unit and a power source.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

The present invention will be described in detail with reference to an embodiment, in which a flexible carrier of the present invention is applied to an electronic calculator.

Figure 1:
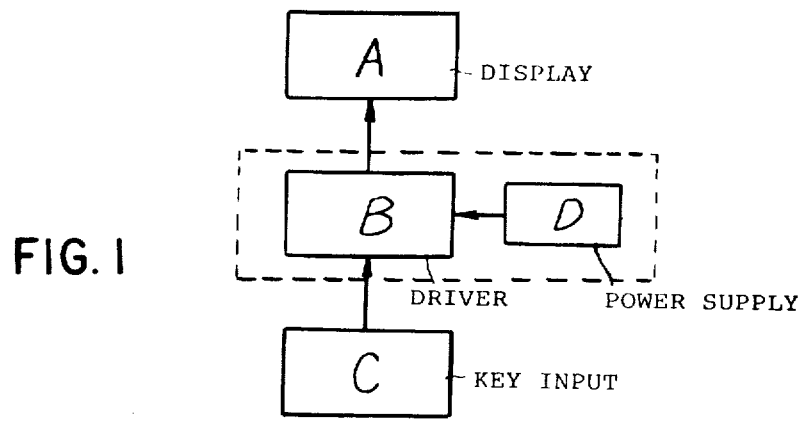
FIG. 1 is a block diagram of an electronic calculator.

The electronic calculator mainly comprises a display unit A, a driver B including a computation circuit, a display driver, etc., a key input means C, and a power supply circuit D, as shown in FIG. 1. The driver B usually comprises a single chip LSI and a peripheral circuit element.

Figure 2:
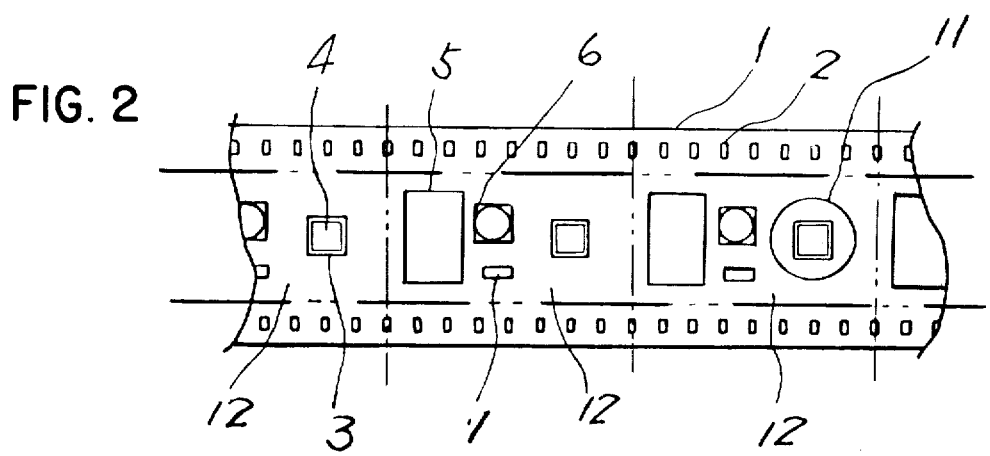
FIG. 2 is a plan view of an embodiment of a flexible carrier of the present invention, on which a semiconductor chip, an electronic circuit chip, a power supply circuit element, and a transformer are integrally mounted.
Figure 3:
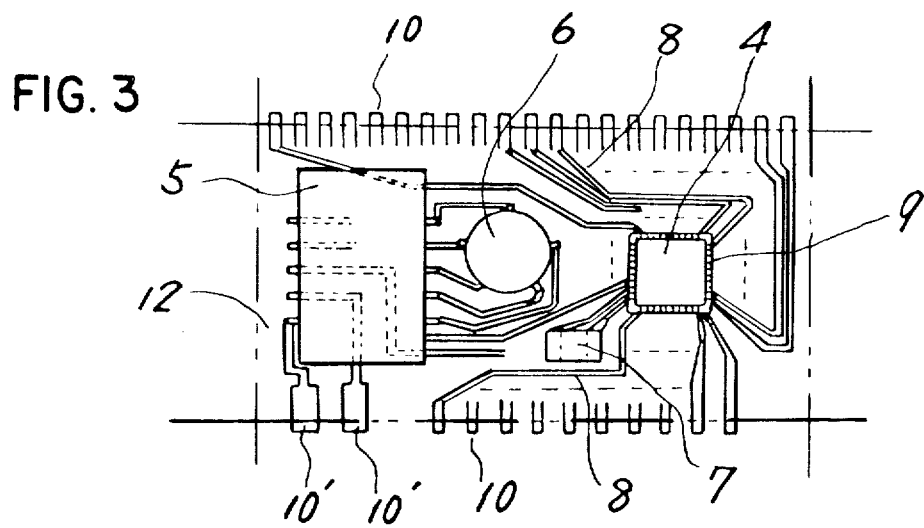
FIG. 3 is a plan view of a single frame of the flexible carrier of FIG. 2.

FIG. 2 shows a flexible carrier tape 1, on both sides of which a plurality of marginal indexing openings 2, or, sprocket holes are formed for transportation and alignment purposes. Wiring patterns 8 made of copper are formed directly on the carrier tape 1 as shown in FIG. 3. The carrier tape 1 can be made of a 35 mm raw movies film such as USAS PH 22.36 in U.S.A. Dimensions for 35 mm motion-picture film, KS-1870, and K-7552 by Japanese Industrial Standard.

The flexible carrier tape 1 is provided with a plurality of apertures 3 substantially equally spaced apart along the length of the tape 1. The aperture 3 is slightly larger than the surface area of an LSI chip 4 which is to be secured therein. The wiring patterns 8 are slightly extended toward the aperture 3, whereby the extended wiring patterns 8 function as input/output terminals when the LSI chip 4 is bonded to the wiring patterns 8 which is referred to as lead 9 hereinafter. On both sides of the flexible carrier tape 1, connection leads 10 and 10' are formed in order to electrically connect the display unit A, the key input means C and a battery E (see FIG. 4) to the electronic components such as the LSI chip 4, a power supply circuit elements 5, a transformer 6 and a peripheral circuit element 7 mounted on the flexible carrier tape 1.

Figure 4:
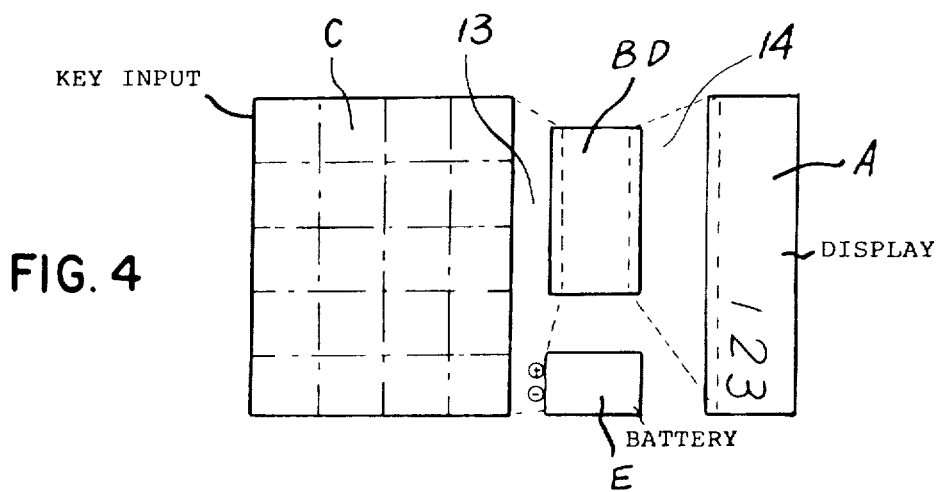
FIG. 4 is a block diagram showing the electrical connection between a key input means, a battery, a display unit and the flexible carrier of FIG. 3.

FIG. 4 schematically shows the electrical connection between the elements B and D formed on the carrier tape 1 and the display unit A, the key input means C and the battery E. The electrical connection is achieved through the connection leads 10 and 10' and film connectors 13 and 14. The leads 10' function to achieve the electrical connection between the power supply circuit elements 5 and the battery E.

Figure 5:
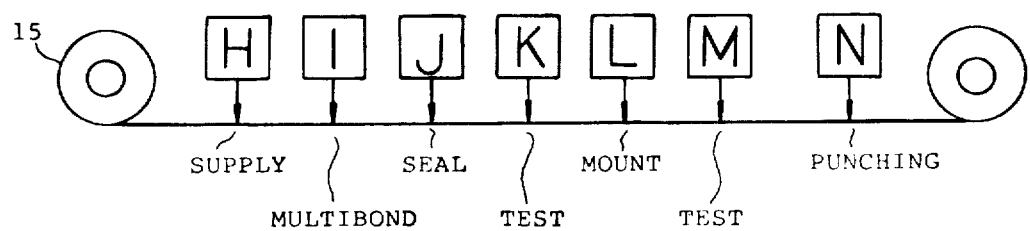
FIG. 5 is a block diagram of fabrication steps of the flexible carrier of FIG. 3.

FIG. 5 shows fabrication steps of the flexible carrier shown in FIG. 3.

Figures 6, 7:
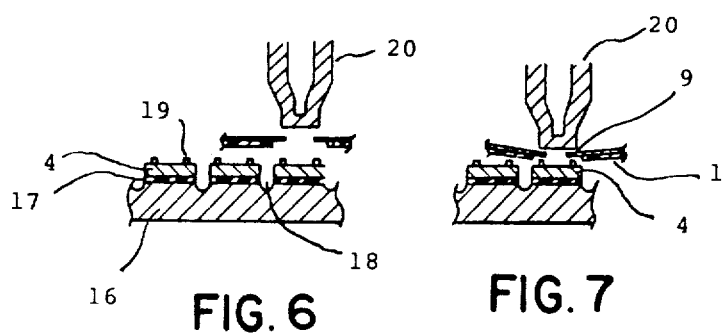
FIGS. 6 and 7 are cross sectional views showing the multibonding step I in the fabrication steps shown in FIG. 5.

First, the flexible carrier tape 1 is supplied from a roll 15 (step H). On the flexible carrier tape 1, the openings 2, the apertures 3, the wiring patterns 8 and the connection leads 10, 10' are formed in advance. The LSI chip 4 is mounted on the carrier tape 1 through the use of multibonding technique (step I). FIGS. 6 and 7 show the multibonding step I. A plurality of the LSI chips 4 are secured on a nest plate 16 via wax 17. Street portions 18 are cut away through the use of a diamond wheel. Alignment among the leads 9 formed on the carrier tape 1, bumps 19 formed on the LSI chip 4 and a bonding tool 20 is achieved as shown in FIG. 6. The leads 9 and the bumps 19 are connected with each other by the depression of the bonding tool 20. When the depression force is removed, the LSI chip 4 is automatically detached from the nest plate 16 and supported by the carrier tape 1, because the wax 17 is melted by the heat created during the multibonding operation.

Figure 8:
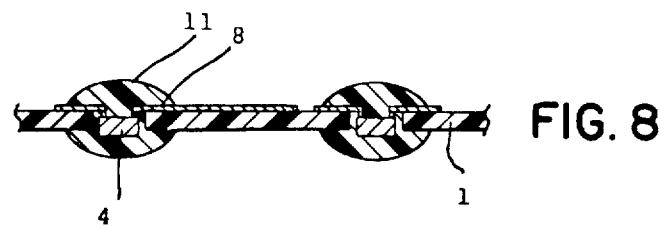
FIG. 8 is a cross sectional view showing the sealing step J in the fabrication steps shown in FIG. 5.

After completion of the multibonding, the LSI chip 4 is coated with suitable resin 11 such as epoxy resin and silicon resin through the use of potting treatment or dripping treatment (step J). FIG. 8 shows the LSI chip 4 coated with the resin 11. Afterward, the LSI chip 4 is tested through the use of a prober (step K).

Figure 9:
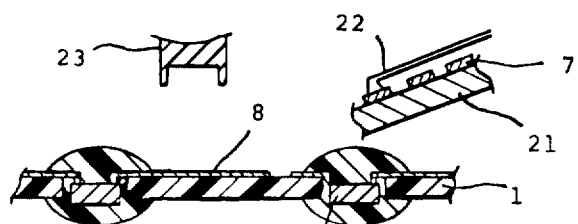
FIGS. 9 and 10 are cross sectional views showing the bonding step L in the fabrication steps shown in FIG. 5.
Figure 10:
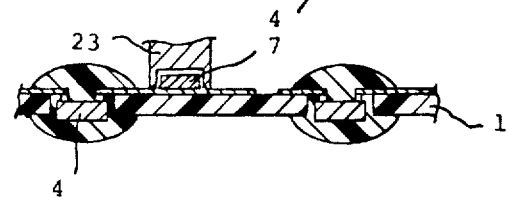

Thereafter, the power supply circuit element 5, the transformer 6 and the peripheral circuit element 7 are mounted on the carrier tape 1 through the use of bonding treatment or soldering treatment (step L). FIGS. 9 and 10 show the bonding operation of the peripheral circuit element 7. The peripheral circuit element 7 supported on a table 21 is transported toward a predetermined position on the carrier tape 1 through the use of a suction bar 22, and bonded to the wiring patterns 8 through the use of a bonding tool 23. Thus formed electronics are tested in their operation as to whether they act as an electronic calculator (step M). Thereafter, a series of punched holes are formed around a single frame of the carrier tape 1 to facilitate separation of a single network as shown by chain lines in FIGS. 2 and 3 (step N).

The tape length required to form a single frame is about 40 mm.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic network for interconnecting a display means, battery and key input means into an operative combination, comprising:
   a flexible carrier film having physical characteristics on the order of 35 mm motion picture film; wiring patterns formed directly on the flexible carrier film;
   a semiconductor chip mounted on the flexible carrier film through the use of multibonding technique;
   a power supply circuit element mounted on the flexible carrier film;
   connection lead means formed on both sides of the flexible carrier film;
   said connection lead means on one side of flexible carrier film being for connection to a said display means external to said carrier film; and
   said connection lead means on the remaining side of said flexible carrier film being for connection to at least a said key input means external to said carrier film.

2. The electronic network of claim 1, which further comprises a peripheral circuit element mounted on the flexible carrier.

3. An electronic network comprising:
   a flexible carrier film;
   wiring patterns formed directly on the flexible carrier film;
   a semiconductor chip mounted on the flexible carrier film through the use of multibonding technique;
   a power supply circuit element mounted on the flexible carrier film;
   a transformer mounted on the flexible carrier film;
   a peripheral circuit element mounted on the flexible carrier film; and
   connection lead means formed on both sides of the flexible carrier film.

4. The electronic network of claim 2, wherein the connection lead means are provided for electrically connecting the electronic network to a battery, a display means, and a key input means.

5. An electronic calculator including a display means, a computation circuit, a display driver, a power source, a power supply circuit, and a key input means, characterized in that the computation circuit, the display drive, and the power supply circuit are integrally mounted on and supported by a flexible carrier film to the exclusion of said display means, said power source and said key input means, and said calculator further including connection lead means formed on both sides of the flexible carrier film in electrical connection with said computation circuit, said display driver and said power supply circuit to electrically interconnect the computation circuit, the display driver, and the power supply circuit mounted on the flexible carrier film with the display means, the power source and the key input means;
   said connection lead means on one side of said flexible carrier film being for connection to a said display means external to said carrier film; and
   said connection lead means on the remaining side of said flexible carrier film being for connection to a said power source and a said key input means external to said carrier film.

6. The electronic calculator of claim 5, which further comprises a peripheral circuit element mounted on the flexible carrier.

7. An electronic calculator including a display means, a computation circuit, a display driver, a power source, a power supply circuit, and a key input means, characterized in that the computation circuit, the display driver, and teh power supply circuit are integrally mounted on and supported by a flexible carrier film to the exclusion of said display means, said power source and said key input means, and connection lead means are formed on both sides of the flexible carrier film to electrically interconnect the computation circuit, the display driver, and the power supply circuit mounted on the flexible carrier film with the display means, the power source and the key input means;
   said connection lead means on one side of said flexible carrier film being for connection to a said means external to said carrier film; and
   said connection lead means on the remaining side of said flexible carrier film being for connection to a said power source and a said key input means external to said carrier film;
   said electronic calculator further comprising a transformer mounted on the flexible carrier film; and a peripheral circuit element mounted on the flexible carrier film.

8. An electronic network for interconnecting a display means, battery and key input means into an operative combination, comprising:

a flexible carrier film;

wiring patterns formed directly on the flexible carrier film;

a semiconductor chip mounted on the flexible carrier film through the use of multibonding technique;

a power supply circuit element mounted on the flexible carrier film;

connection lead means formed on both sides of the flexible carrier film for interconnection with a said display means, a said battery and a said key input means;

said connection lead means being extended from said both sides of the flexible carrier film;

said connection lead means on one side of said flexible carrier film being for connection to a said display means external to said carrier film; and said connection lead means on the remaining side of said flexible carrier film being for connection to at least a said key input means external to said carrier film.

9. A continuous flexible carrier film of circuit modules, each said module being severable from said flexible carrier film and comprised of a frame of said continuous flexible carrier film, and each said frame including an electronic network for interconnecting a display means, battery and key input means into an operative combination, said network comprising:

wiring patterns formed directly on the flexible carrier film;

a semiconductor chip mounted on the flexible carrier film through the use of multibonding technique;

a power supply circuit element mounted on the flexible carrier film;

connection lead means formed on both sides of the flexible carrier film;

said connection lead means on one side of said flexible carrier film being for connection to a said display means external to said carrier film; and said connection lead means on the remaining side of said flexible carrier film being for connection to at least a said key input means external to said carrier film;

each said circuit module being connectable through said connection lead means to external circuit means for testing in situ in said continuous flexible carrier film.

10. A continuous flexible carrier film of circuit modules, each said module being severable for said flexible carrier film and comprised of a frame of said continuous flexible carrier film, and each said frame including an electronic network for interconnecting a display means, battery and key input means into an operative combination, said network comprising:

a computation circuit, a display driver, and a power supply circuit integrally mounted on said flexible carrier film, and connection lead means formed on both sides of the flexible carrier film to electrically interconnect said computation circuit said display driver, and said power supply circuited mounted on the flexible carrier film with a said display means, a said power source and a said key input means;

said connection lead means on one side of said flexible carrier film being for connection to a said display means external to said carrier film; and said connection lead means on the remaining side of said flexible carrier film being for connection to a said power source and a said key input means external to said carrier film;

each said circuit module being connectable through said connection lead means to external circuit means for testing in situ in said continuous flexible carrier film.

11. A continuous flexible carrier film of circuit modules, each said module being severable from said flexible film and comprised of a frame of said continuous flexible carrier film, and each said frame including an electronic network for interconnecting a display means, battery and key input means into an operative combination, said network comprising:

wiring patterns formed directly on the flexible carrier film;

a semiconductor chip mounted on the flexible carrier film through the use of multibonding technique;

a power supply circuit element mounted on the flexible carrier film;

connection lead means formed on both sides of the flexible carrier film;

said connection lead means being extended from said both sides of the flexible carrier film;

said connection lead means on one side of said flexible carrier film being for connection to a said display means external said carrier film; and said connection lead means on the remaining side of said flexible carrier film being for connection to at least a said key input means external to said carrier film;

each said circuit module being connectable through said connection lead means for testing in situ in said continuous flexible carrier film.

* * * * *